US011077827B2

(12) United States Patent
Lee

(10) Patent No.: US 11,077,827 B2
(45) Date of Patent: Aug. 3, 2021

(54) VEHICLE CARD KEY AND METHOD OF MANUFACTURING THE SAME

(71) Applicant: HYUNDAI MOBIS Co., Ltd., Seoul (KR)

(72) Inventor: Sang Gwon Lee, Incheon (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 16/547,571

(22) Filed: Aug. 22, 2019

(65) Prior Publication Data

US 2020/0079321 A1    Mar. 12, 2020

(30) Foreign Application Priority Data

Sep. 12, 2018 (KR) .................. 10-2018-0108926

(51) Int. Cl.
| | |
|---|---|
| G06K 7/10 | (2006.01) |
| B60R 25/22 | (2013.01) |
| H05K 1/18 | (2006.01) |
| H05K 5/00 | (2006.01) |
| H05K 3/28 | (2006.01) |
| E05B 19/00 | (2006.01) |
| H01M 50/209 | (2021.01) |

(52) U.S. Cl.
CPC ........ *B60R 25/225* (2013.01); *E05B 19/0082* (2013.01); *G06K 7/10366* (2013.01); *H01M 50/209* (2021.01); *H05K 1/18* (2013.01); *H05K 3/284* (2013.01); *H05K 5/0086* (2013.01); *H01M 2220/30* (2013.01); *H05K 2201/09027* (2013.01); *H05K 2201/09036* (2013.01); *H05K 2201/10037* (2013.01); *H05K 2201/10378* (2013.01); *H05K 2203/1327* (2013.01)

(58) Field of Classification Search
CPC ...... B60R 25/225; H05K 1/18; H05K 5/0086; H05K 3/284; H05K 2201/10037; H05K 2201/10378; H05K 2201/09027; H05K 2201/09036; H05K 2203/1327; G06K 7/10366; G06K 7/10; H01M 2/1066; H01M 2220/30; H01M 2/00; G07C 9/00944; E05B 19/0082
See application file for complete search history.

(56) References Cited

U.S. PATENT DOCUMENTS

| | | | | |
|---|---|---|---|---|
| 8,953,331 B2 * | 2/2015 | Sugimoto | .......... | G07C 9/00944 361/757 |
| 9,443,182 B2 * | 9/2016 | Wada | ................. | G06K 19/0706 |
| 10,137,861 B2 * | 11/2018 | Park | .................... | E05B 19/0082 |

(Continued)

*Primary Examiner* — Seung H Lee
(74) *Attorney, Agent, or Firm* — H.C. Park & Associates, PLC

(57) ABSTRACT

The present invention relates to a vehicle card key in which a manufacturing defect rate of the vehicle card key may be reduced when the vehicle card key is manufactured, and a method of manufacturing the same. A PCB substrate which has a first key holder receiving groove and a first battery cover; a case which has a second key holder accommodation groove and a second battery cover accommodation groove; a key holder which accommodates the mechanical key; a battery terminal which includes a first terminal and a second terminal; and a battery cover which allows one surface of the battery to be in contact with the first terminal and the other surface of the battery to be in contact with the second terminal.

11 Claims, 10 Drawing Sheets

(56) References Cited

U.S. PATENT DOCUMENTS

| | | | |
|---|---|---|---|
| 10,994,699 B2* | 5/2021 | Hyun | B60R 25/24 |
| 2012/0012659 A1* | 1/2012 | Sugimoto | E05B 19/046 |
| | | | 235/492 |
| 2018/0165903 A1* | 6/2018 | Kim | E05B 19/0082 |

* cited by examiner

VEHICLE CARD KEY AND METHOD OF MANUFACTURING THE SAME

CROSS-REFERENCE TO RELATED APPLICATION

This application claims priority to and the benefit of Korean Patent Application No. 10-2018-0108926 filed on Sep. 12, 2018, the disclosure of which is incorporated herein by reference in its entirety.

BACKGROUND

Field

Exemplary embodiments relate to a vehicle card key and a method of manufacturing the same, and more particularly, to a vehicle card key in which a manufacturing defect rate of the vehicle card key may be reduced when the vehicle card key is manufactured, and a method of manufacturing the same.

Discussion of the Background

In general, vehicle card keys of smart key systems are provided with wireless transceivers.

The vehicle card key may be carried by a user, and when the user gets into a vehicle, the vehicle card key may communicate with a controller disposed in the vehicle to unlock a vehicle door, start an engine, or perform other operations.

The vehicle card key includes a circuit board for mounting a circuit unit in a resin case and a battery serving as a power source.

The wireless transceiver includes a mechanical key stored therein, which is used in case of an unexpected situation in which the wireless transceiver may not be used due to a discharged battery or due to damage to the transceiver.

The mechanical key is accommodated in a separate accommodation space in the resin case.

In an emergency, the mechanical key is taken out from the accommodation space of the resin case by the user and is used to unlock a door or perform other operations.

Recently, as a more complicated and sophisticated system including more components is being used, a wireless transceiver in a vehicle card key has been required to have a volume thereof considerably reduced so that a user can conveniently carry the wireless transceiver.

To this end, conventionally, when a vehicle card key is manufactured, a component non-mounting surface of a printed circuit board (PCB) substrate, on which components are not mounted, is pressed against and fixed to a lower plate of a mold, a preset space is formed on a component mounting surface of the PCB substrate, on which components are mounted, the lower plate is covered with an upper plate of the mold, and a molding material is injected into the preset space, thereby forming a case.

In order for a mechanical key or a battery to be accommodated in the case and be electrically connected to the PCB substrate, a mechanical keyhole slide or a battery hole slide is coupled to the PCB substrate, and then, the case is molded to form a mechanical keyhole or a battery hole.

On the other hand, the mechanical keyhole slide or the battery hole slide is engaged and coupled to a latch.

The latch is formed on the lower plate of the mold and protrudes from an upper portion of the PCB substrate through a through-hole of the PCB substrate.

Accordingly, conventionally, the case is molded into a shape in which the mechanical keyhole slide or the battery hole slide is engaged with the latch, and thus, the precision of the mold should be very high. In addition, during molding, when the mechanical keyhole slide or the battery hole slide is engaged with the latch, a bonding surface of the latch or the slide is often broken. The latch and the slide are misaligned with each other, which is a main cause of a lifting phenomenon of the PCB substrate.

In addition, when the mechanical hole slide or the battery hole slide enters the PCB substrate, the mechanical hole slide or the battery hole slide is caught by a battery terminal, which acts as a factor in defects, resulting in a decrease in operation efficiency.

The above information disclosed in this Background section is only for enhancement of understanding of the background of the invention and, therefore, it may contain information that does not constitute prior art.

SUMMARY

Exemplary embodiments of the present invention provide a vehicle card key in which a manufacturing defect rate of the vehicle card key may be reduced when the vehicle card key is manufactured, and a method of manufacturing the same.

Additional features of the invention will be set forth in the description which follows, and in part will be apparent from the description, or may be learned by practice of the invention.

An exemplary embodiment of the present invention discloses a vehicle card key including a printed circuit board (PCB) substrate which has a first key holder accommodation groove formed in one direction of the PCB substrate, a first battery cover accommodation groove formed in the other direction of the PCB substrate, and one surface on which various circuit elements for wireless transmission and reception with a vehicle are mounted, wherein a mechanical key is assembled in the first key holder accommodation groove and a battery is assembled in the first battery cover accommodation groove; a case which has a second key holder accommodation groove formed at a position corresponding to the first key holder accommodation groove and a second battery cover accommodation groove formed at a position corresponding to the first battery cover accommodation groove and molds the surface of the PCB substrate on which the circuit elements are mounted; a key holder which accommodates the mechanical key and which is fixed to the first key holder accommodation groove; a battery terminal which includes a first terminal fixed to one surface of the PCB substrate and a second terminal spaced apart from the first terminal and fixed to the other surface of the PCB substrate and fixed to the first battery cover accommodation groove; and a battery cover in which a battery is accommodated and which is inserted between the first terminal and the second terminal and allows one surface of the battery to be in contact with the first terminal and the other surface of the battery to be in contact with the second terminal.

The case may be formed by fixing a surface of the PCB substrate on which the various circuits are not mounted to a lower mold, defining a preset space on the surface of the PCB substrate on which the various circuit elements are mounted, lowering an upper mold, and injecting a molding material into the preset space.

The key holder and the battery terminal may be fixed to the PCB substrate through any one coupling method of screw coupling, fusion coupling, and welding coupling.

The first terminal may have cover fixing holes which fix the battery cover.

The battery cover may include cover supports which are in contact with both inner surfaces of the first battery cover accommodation groove or the second battery cover accommodation groove and cover fixing protrusions which are formed at positions corresponding to the cover fixing holes and inserted into the cover fixing holes.

The battery cover may further include a stand which is formed in an area not overlapping the second terminal and supports the other surface of the battery.

According to another aspect of the present invention, there is provided a method of manufacturing a vehicle card key, the method including providing a PCB substrate which has one surface on which various circuit elements for wireless transmission and reception with a vehicle are mounted and the other surface on which circuit elements are not mounted and has a first key holder accommodation groove formed in one direction of the PCB substrate and a first battery cover accommodation groove formed in the other direction of the PCB substrate; fixing the surface of the PCB substrate on which the circuit elements are not mounted to a lower mold; disposing an upper mold on the surface of the PCB substrate on which the circuit elements are mounted; defining a preset space on the surface of the PCB substrate on which the various circuit elements are mounted and lowering the upper mold; injecting a molding material into the preset space and forming a case; curing and taking out the case; and fixing a key holder to the first key holder accommodation groove and fixing a battery terminal to the first battery cover accommodation groove.

The lower mold may include a first forming portion which protrudes from an upper surface of the lower mold, is inserted into the first key holder accommodation groove, and forms a second key holder accommodation groove in the case and a second forming portion which protrudes from the upper surface, is inserted into the first battery cover accommodation groove, and forms a second battery cover accommodation groove in the case.

The key holder and the battery terminal may be fixed to the PCB substrate through any one coupling method of screw coupling, fusion coupling, and welding coupling.

The battery terminal may include a first terminal which is fixed to one surface of the PCB substrate and a second terminal which is spaced apart from the first terminal and fixed to the other surface of the PCB substrate, wherein the first terminal has cover fixing holes which fix a battery cover.

The battery cover may include cover supports which are in contact with both inner surfaces of the first battery cover accommodation groove and cover fixing protrusions which are formed at positions corresponding to the cover fixing holes and inserted into the cover fixing holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION

Figure 1:
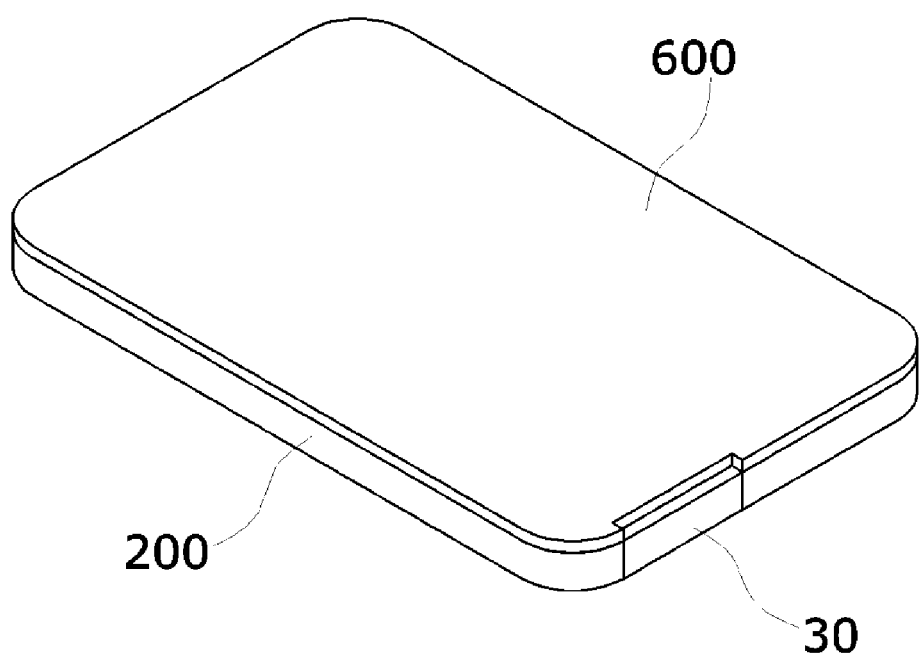
FIG. 1 is a perspective view illustrating a vehicle card key according to an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. Like reference numerals in the drawings denote like elements.

Various advantages and features of the present invention and methods accomplishing thereof will become apparent from the following description of embodiments with reference to the accompanying drawings. However, the present invention is not be limited to the embodiments set forth herein but may be implemented in many different forms. The present embodiments may be provided so that the disclosure of the present invention will be complete, and will fully convey the scope of the invention to those skilled in the art and therefore the present invention will be defined within the scope of claims. Like reference numerals throughout the description denote like elements.

Unless defined otherwise, it is to be understood that all the terms (including technical and scientific terms) used in the specification has the same meaning as those that are understood by those who skilled in the art. Further, the terms defined by the dictionary generally used should not be ideally or excessively formally defined unless clearly defined specifically. It will be understood that for purposes of this disclosure, "at least one of X, Y, and Z" can be construed as X only, Y only, Z only, or any combination of two or more items X, Y, and Z (e.g., XYZ, XYY, YZ, ZZ). Unless particularly described to the contrary, the term "comprise", "configure", "have", or the like, which are described herein, will be understood to imply the inclusion of the stated components, and therefore should be construed as including other components, and not the exclusion of any other elements.

Hereinafter, exemplary embodiments of the present invention will be described in more detail with reference to the accompanying drawings.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
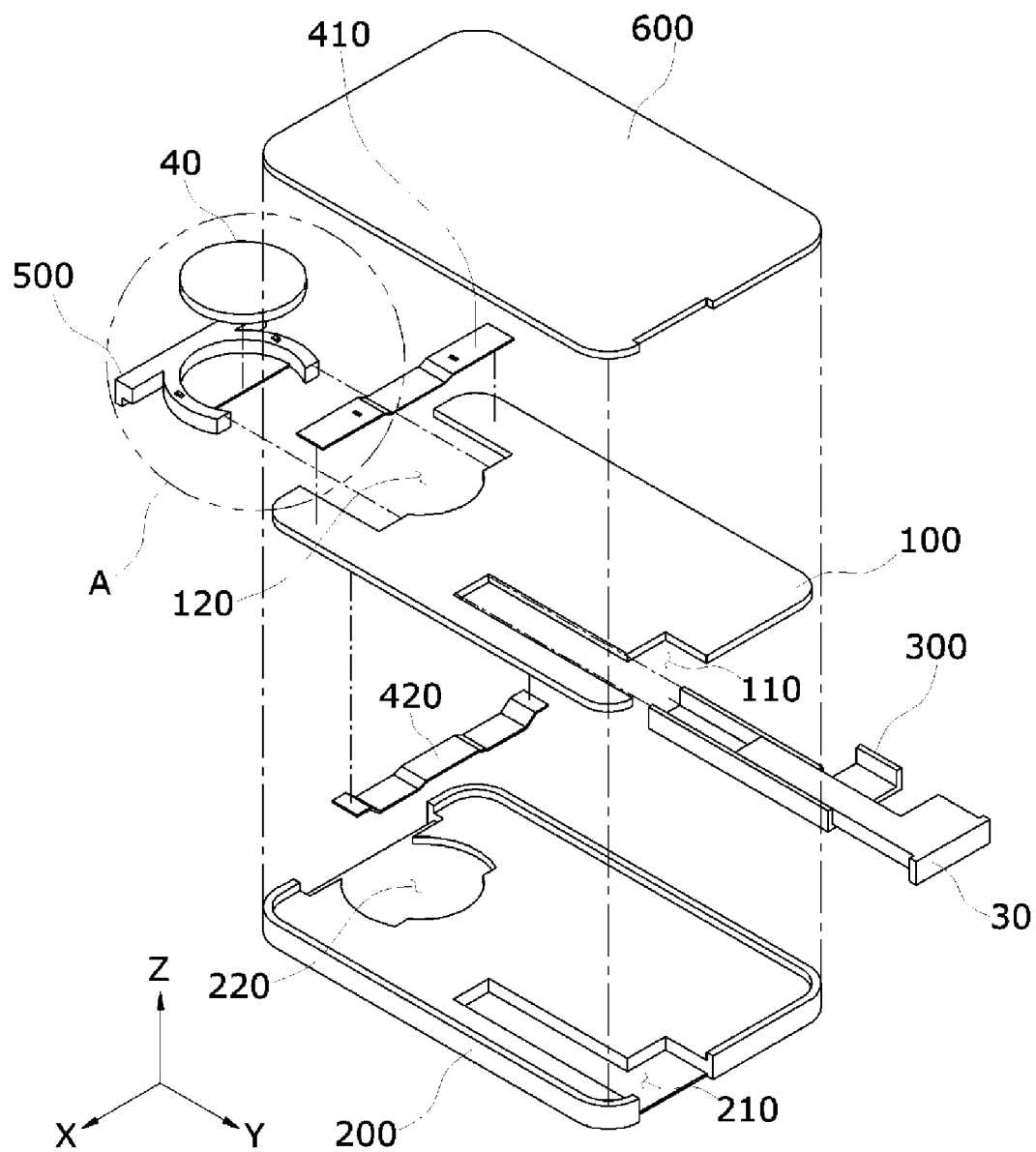
FIG. 2 is an exploded perspective view illustrating the vehicle card key according to the embodiment of the present invention.
Figure 3A:
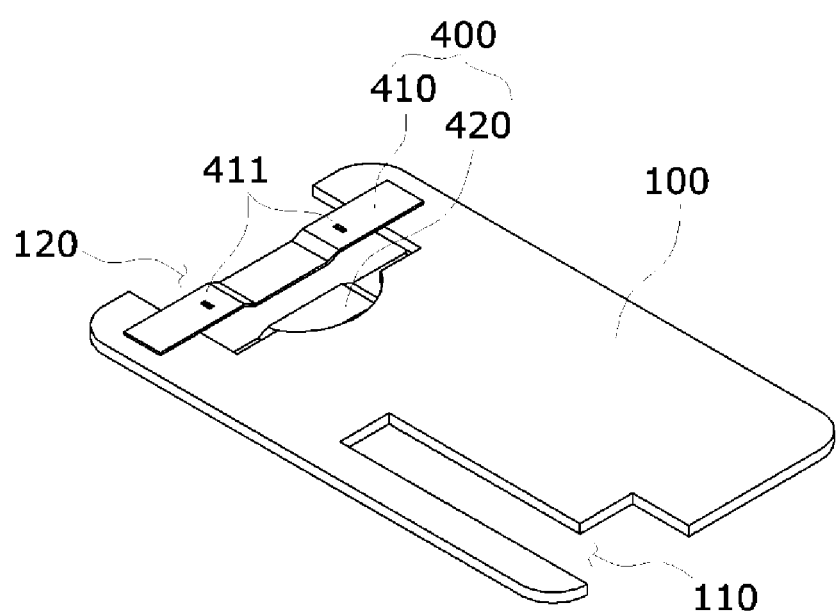
FIGS. 3A and 3B are perspective views illustrating a printed circuit board (PCB) substrate and a battery terminal according to the embodiment of the present invention.
Figure 3B:
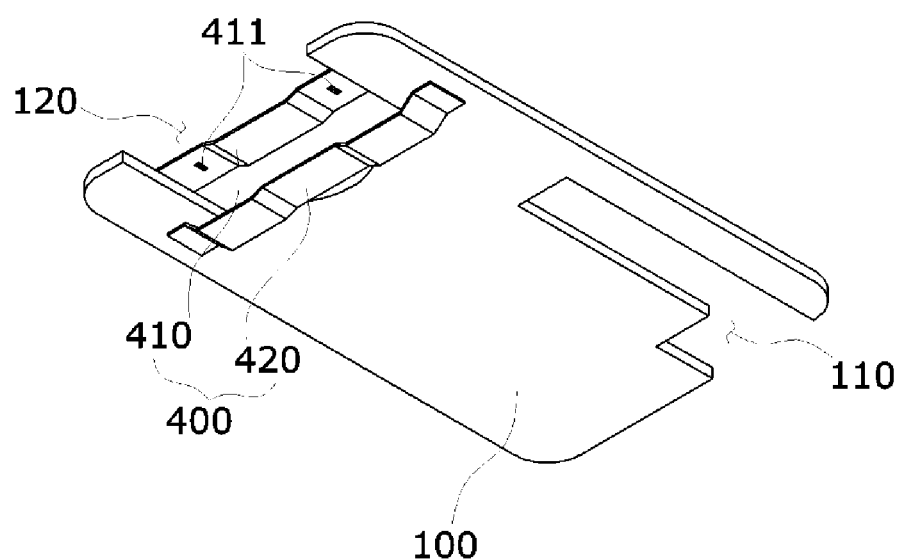
Figure 4:
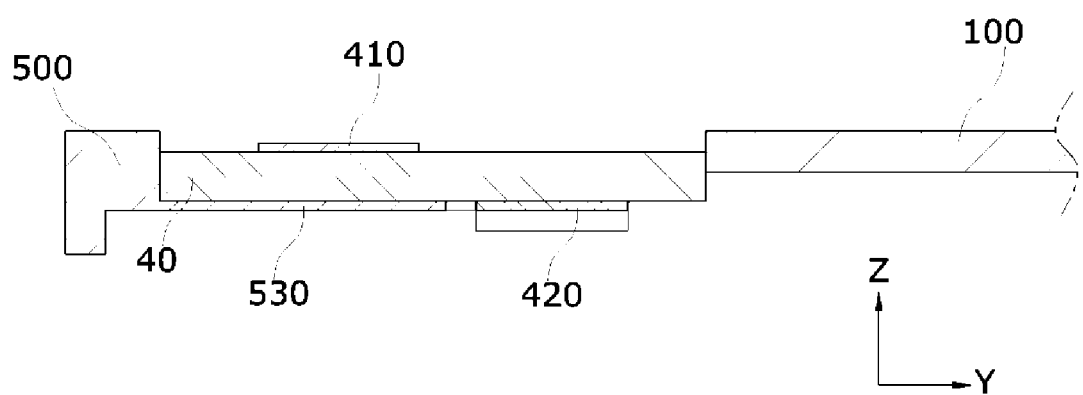
FIG. 4 is a cross-sectional view illustrating a state in which a battery and the battery terminal are coupled to each other according to the embodiment of the present invention.
Figure 5:
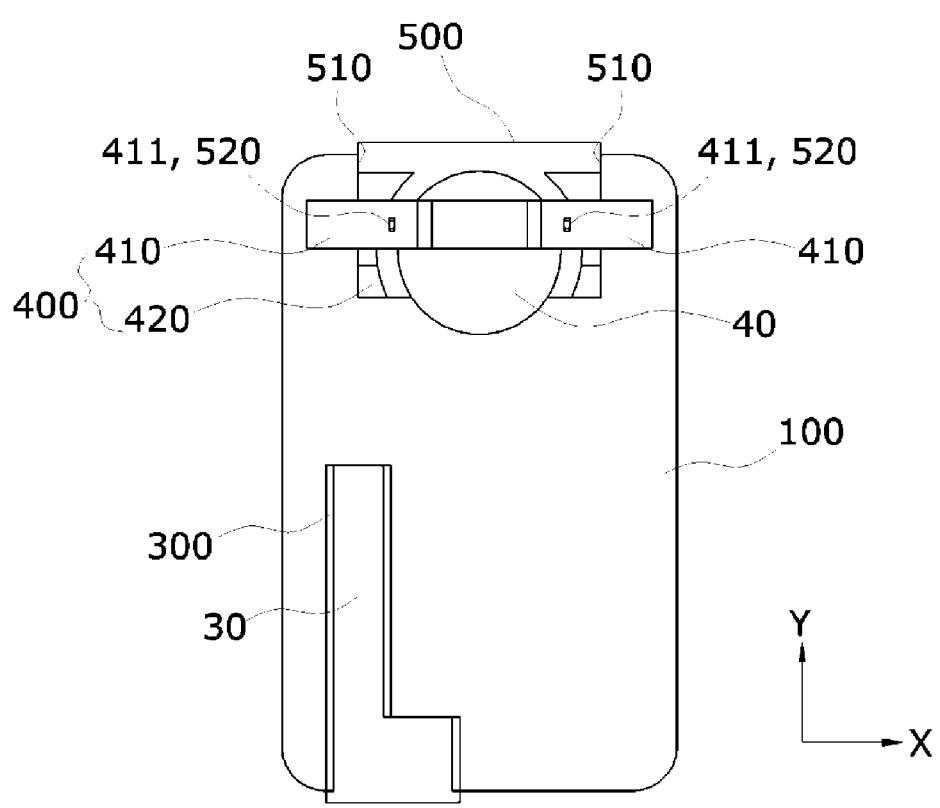
FIG. 5 is a plan view illustrating the vehicle card key according to the embodiment of the present invention.
Figure 6A:
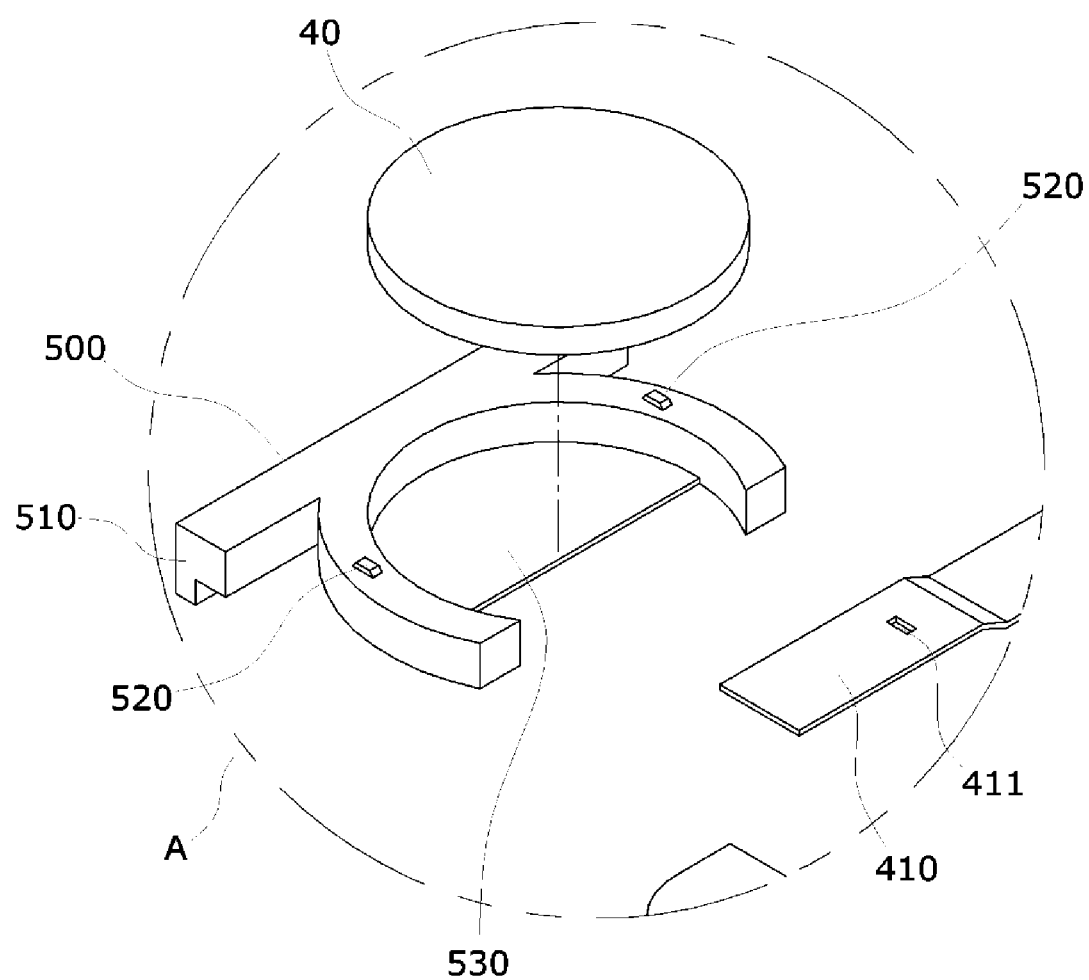
FIG. 6A is an enlarged view illustrating portion A shown in FIG. 2.
Figure 6B:
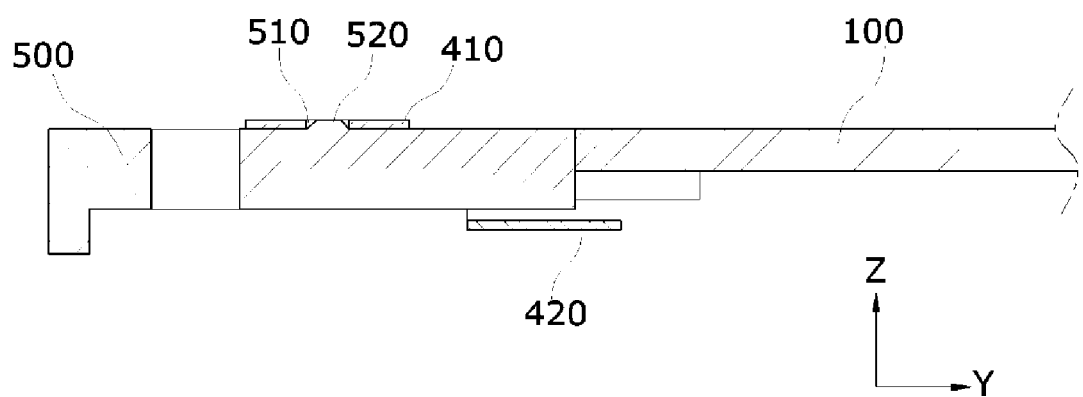
FIG. 6B is a cross-sectional view illustrating a state in which the battery terminal and a battery cover are coupled according to the embodiment of the present invention.

FIG. 1 is a perspective view illustrating a vehicle card key according to an embodiment of the present invention. FIG. 2 is an exploded perspective view illustrating the vehicle card key according to the embodiment of the present invention. FIGS. 3A and 3B are a perspective view and a bottom perspective view illustrating a printed circuit board (PCB) substrate and a battery terminal according to the embodiment of the present invention. FIG. 4 is a cross-sectional view illustrating a state in which a battery and the battery terminal are coupled to each other according to the embodiment of the present invention. FIG. 5 is a plan view illustrating the vehicle card key according to the embodiment of the present invention. FIG. 6A is an enlarged view illustrating portion A shown in FIG. 2. FIG. 6B is a cross-sectional view illustrating a state in which the battery terminal and a battery cover are coupled according to the embodiment of the present invention.

Referring to FIGS. 1 to 6B, the vehicle card key according to the present embodiment, in which a mechanical key 30 and a battery 40 are accommodated, includes a PCB substrate 100, a case 200, a key holder 300, a battery terminal 400, and a battery cover 500.

Meanwhile, in the case of similar situations or the like as well as a situation in which the battery 40 is consumed or the card key is damaged, the mechanical key 30 is taken out from the PCB substrate 100 and the case 200 and is used to unlock a door or other operations.

A conductive pattern is formed or various circuit elements for wireless transmission and reception with a vehicle are mounted only on one surface of the PCB substrate 100, and circuit elements are not mounted on the other surface of the PCB substrate 100.

Here, when the card key receives a request signal for an identification code from the vehicle, the various circuit elements transmit a response signal in response to the request signal.

A first key holder accommodation groove 110, in which the mechanical key 30 is assembled, is formed in one direction of the PCB substrate 100, and a first battery cover accommodation groove 120, in which the battery 40 is assembled, is formed in the other direction of the PCB substrate 100.

In order to protect the PCB substrate 100 from temperature, moisture, electricity, shock, and ultraviolet rays, the case 200 molds the surface of the PCB substrate 100 on which the circuit elements are mounted. The case 200 seals the circuit elements mounted on the PCB substrate 100.

The case 200 has a second key holder accommodation groove 210 formed at a position corresponding to the first key holder accommodation groove 110 and a second battery cover accommodation groove 220 formed at a position corresponding to the first battery cover accommodation groove 120.

The key holder 300 in which the mechanical key 30 is accommodated is inserted into the first key holder accommodation groove 110 and the second key holder accommodation groove 210. The battery cover 500 in which the battery 40 is accommodated is inserted into the first battery cover accommodation groove 120 and the second battery cover accommodation groove 220.

The case 200 is formed by fixing the surface of the PCB substrate 100 on which the various circuits are not mounted to a lower mold 10, defining a space, which is set according to a shape of the case, on the surface of the PCB substrate 100 on which the various circuit elements are mounted, lowering an upper mold 20, and injecting a molding material into the set space.

Meanwhile, the case 200 may be made of an epoxy molding compound (EMC) resin.

The EMC resin is a thermosetting resin containing epoxy as a main raw material. Due to characteristics of a material of the case 200, the case 200 provides electrical and mechanical stability to the PCB substrate 100 and assists in dissipating heat generated during use.

The key holder 300 accommodates the mechanical key 30 assembled to the PCB substrate 100 and is fixed to the first key holder accommodation groove 110 of the PCB substrate 100.

The key holder 300 extends from one end to the other end of the mechanical key 30.

The key holder 300 may be made of stainless steel in the form of a thin plate.

The stainless steel has tensile strength that is about twice that of a common metal and is thinner than the common metal when the stainless steel has the same tensile strength as the common metal.

Accordingly, the key holder 300 made of the stainless steel may increase durability and reduce a thickness and weight.

The battery terminal 400 is fixed to the first battery cover accommodation groove 120 and is electrically connected to the battery 40 used as a power source of the card key.

The battery terminal 400 includes a first terminal 410 and a second terminal 420.

The first terminal 410 is any one of a negative terminal and a positive terminal. As shown in FIGS. 3A and 4, the first terminal 410 is fixed to one surface of the PCB substrate 100 and is electrically connected to one surface of the battery 40.

A cover fixing hole 411 for fixing the battery cover 500 to the battery terminal 400 is formed in the first terminal 410.

The second terminal 420 is the remaining one of the negative terminal and the positive terminal. As shown in FIGS. 3B and 4, the second terminal 420 is spaced a distance apart from the first terminal 410, is fixed to the other surface of the PCB substrate 100, and is electrically connected to the other surface of the battery 40.

The battery cover 500 in which the battery 40 is accommodated is accommodated between the first terminal 410 and the second terminal 420.

Accordingly, the battery terminal 400 may be used as a power source of the card key and, at the same time, may effectively restrict the battery 40 from being moved in a vertical direction, i.e., a Z-axis direction shown in FIGS. 2 and 4.

Meanwhile, the key holder 300 and the battery terminal 400 are fixed to the PCB substrate 100 through any one coupling method of screw coupling, fusion coupling, and welding coupling.

Therefore, the mechanical key 30 accommodated in the key holder 300 and the battery cover 500 inserted between the first terminal 410 and the second terminal 420 may be firmly coupled to the PCB substrate 100.

The battery cover 500 accommodates the battery 40. When a user gets into a vehicle and allows the vehicle card key to communicate with a controller disposed in the vehicle to unlock a vehicle door, start an engine, or perform other operations, the battery cover 500 is inserted between the first terminal 410 and the second terminal 420 fixed to the first battery cover accommodation groove 120 to allow one surface of the battery 40 to be in contact with the first terminal 410 and the other surface of the battery 40 to be in contact with the second terminal 420.

When the battery 40 is consumed and needs to be replaced with a new battery 40, the battery cover 500 may be taken out from a space between the first terminal 410 and the second terminal 420 fixed to the first battery cover accommodation groove 120 in a sliding manner so that the battery 40 accommodated in the battery cover 500 may be replaced.

Thus, the battery cover 500 allows the battery 40 to easily be in electrical contact with the first terminal 410 and the second terminal 420 and allows the consumed battery 40 to be easily replaced from the PCB substrate 100 and in the case 200.

The battery cover 500 includes cover supports 510, cover fixing protrusions 520, and a stand 530.

The cover supports 510 protrude from both side surfaces of the battery cover 500 and are in contact with both side surfaces of the first battery cover accommodation groove 120 of the PCB substrate 100 and the second battery cover accommodation groove 220 of the case 200 when the battery cover 500 is inserted between the first terminal 410 and the second terminal 420.

Therefore, the cover support 510 may effectively restrict the battery cover 500, in which the battery 40 is accommodated, from being moved in a lateral direction, i.e., an X-axis direction shown in FIGS. 2 and 5.

Meanwhile, while it has been described that the cover supports 510 are in contact with the both side surfaces of the first battery cover accommodation groove 120 and the second battery cover accommodation groove 220, the cover supports 510 may be in contact with the both side surfaces of any one of the first battery cover accommodation groove 120 and the second battery cover accommodation groove 220 as long as the cover supports 510 may effectively restrict the battery cover 500 from being moved in a lateral direction.

The cover fixing protrusions 520 are formed at positions corresponding to cover fixing holes 411 formed in the first terminal 410 in a state in which the battery cover 500 is inserted between the first terminal 410 and the second terminal 420 as shown in FIG. 6A. When the battery cover 500 is inserted between the first terminal 410 and the second terminal 420, the cover fixing protrusions 520 are inserted into the cover fixing holes 411.

Therefore, the cover fixing protrusions 520 may effectively restrict the battery cover 500, in which the battery 40 is accommodated, from being moved in a back-and-forth direction, i.e., a Y-axis direction shown in FIGS. 2 and 6B.

As described above, according to the present invention, the battery cover 500 may be restricted from being moved in the Z-axis direction by the first terminal 410 and the second terminal 420, may be restricted from being moved in the X-axis direction by the cover support 510, and may be restricted from being moved in the Y axis direction by the cover fixing protrusion 520 and the cover fixing hole 411, thereby effectively preventing movement from being generated from the PCB substrate 100.

On the other hand, in the present invention, while it has been described that the cover fixing protrusions 520 and the cover fixing holes 411 are respectively formed on an upper surface of the battery cover 500 and in the first terminal 410 of the battery terminal 400 to be coupled on the PCB substrate 100, as long as the cover fixing protrusions 520 and the cover fixing holes 411 may firmly fix the battery cover 500 to the PCB substrate 100, the cover fixing protrusions 520 and the cover fixing holes 411 may be respectively formed on both side surfaces of the cover support 510 and in an inner surface of the first battery cover accommodation groove 120 or the second battery cover accommodation groove 220 or may be formed on a lower surface of the battery cover 500 and in the second terminal 420 of the battery terminal 400 to be coupled below the PCB substrate 100.

The stand 530 supports the other surface of the battery 40 and is formed in a region that does not overlap the second terminal 420 when the battery cover 500 is inserted between the first terminal 410 and the second terminal 420.

Thus, the stand 530 allows the other surface of the battery 40 and the second terminal 420 to be electrically contacted to each other.

Hereinafter, a method of manufacturing a vehicle card key according to the present invention will be described in detail with reference to the accompanying drawings.

Figure 7:
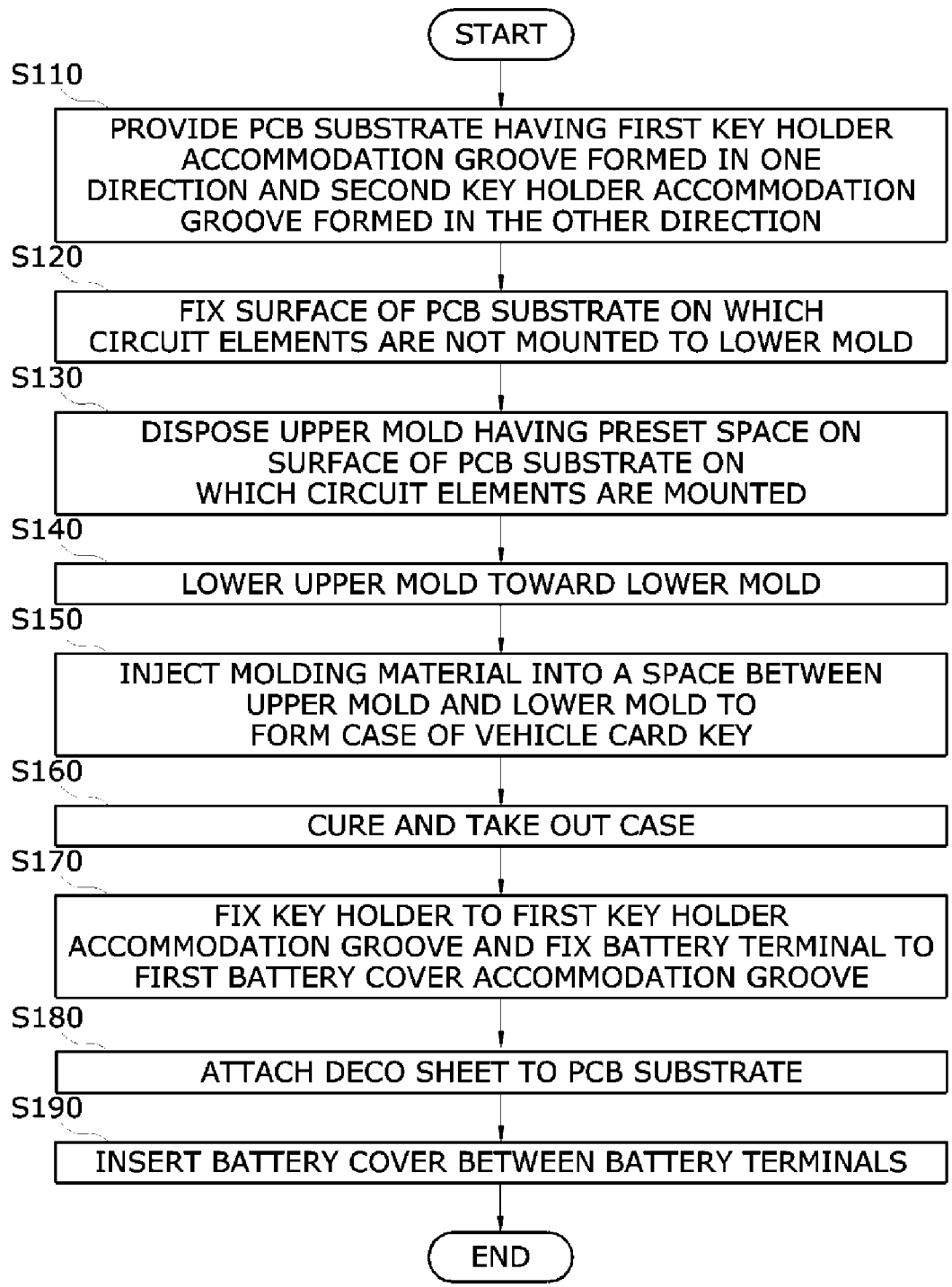
FIG. 7 is a flowchart illustrating a method of manufacturing a vehicle card key according to an embodiment of the present invention.
Figure 8:
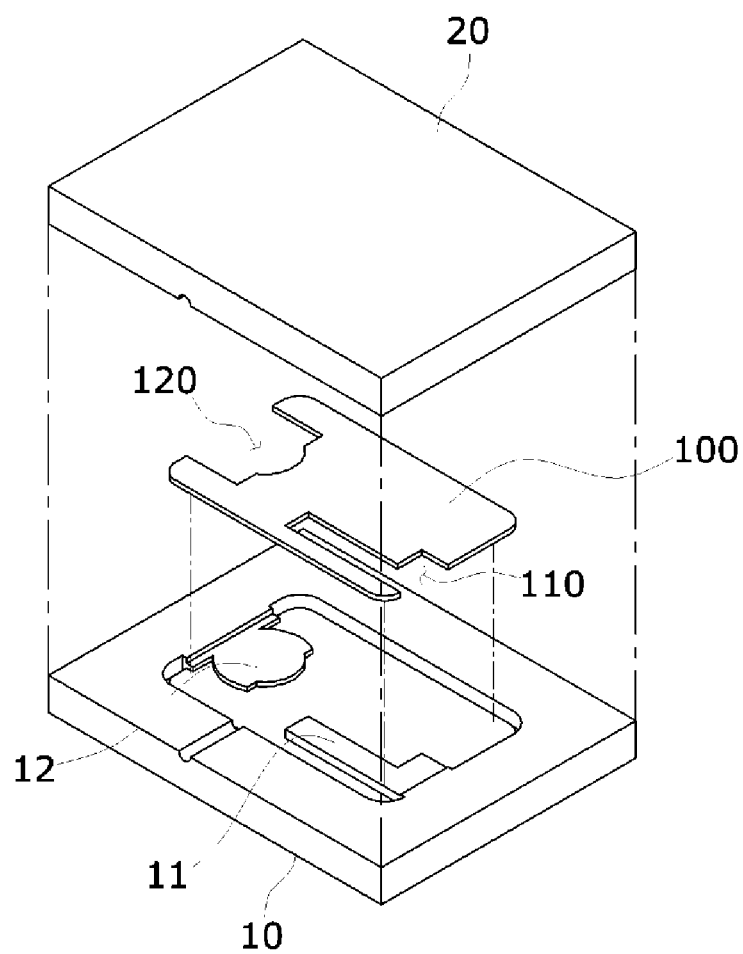
FIG. 8 is an exploded perspective view illustrating a lower mold and an upper mold according to an embodiment of the present invention.

FIG. 7 is a flowchart illustrating a method of manufacturing a vehicle card key according to an embodiment of the present invention, and FIG. 8 is an exploded perspective view illustrating a lower mold and an upper mold according to an embodiment of the present invention.

Referring to FIG. 7, first, the PCB substrate 100 is provided (S110), wherein the PCB substrate 100 has one surface on which various circuit elements for wireless transmission and reception with a vehicle are mounted and the other surface on which circuit elements are not mounted and has the first key holder accommodation groove 110 formed in one direction thereof and the first battery cover accommodation groove 120 formed in the other direction thereof.

The surface of the PCB substrate 100 on which the circuit elements are not mounted is fixed to the lower mold 10 having a space set according to a shape of the case (S120).

The upper mold 20 is disposed on the surface of the PCB substrate 100 on which the circuit elements are mounted (S130).

The upper mold 20 is lowered toward the lower mold 10 (S140).

A molding material is injected into an interior space preset between the upper mold 20 and the lower mold 10 to form the case 200 of the vehicle card key (S150).

Meanwhile, the molding material includes an EMC resin.

The EMC resin is a thermosetting resin containing epoxy as a main raw material. Due to characteristics of a material of the case 200, the case 200 provides electrical and mechanical stability to the PCB substrate 100 and assists in dissipating heat generated during use.

As shown in FIG. 8, the lower mold 10 includes a first forming portion 11 which protrudes from an upper surface of the lower mold 10 and is inserted into the first key holder accommodation groove 110 of the PCB substrate 100 and a second forming portion 12 which protrudes and is inserted into the first battery cover accommodation groove 120 of the PCB substrate 100.

Therefore, when the molding material is injected into the preset interior space between the lower mold 10 and the upper mold 20, the second key holder accommodation groove 210 and the second battery cover accommodation groove 220 may be formed in the case 200 by the first forming portion 11 and the second forming portion 12 of the lower mold 10, respectively.

Accordingly, unlike the related art in which, since a mechanical keyhole slide for forming an arrangement region of a mechanical key or a battery hole slide for forming an arrangement region of a battery in a card key is engaged and coupled to a latch, precision of a mold should be very high, and a bonding surface of the latch or the slide is broken to increase a defect factor and reduce operation efficiency, according to the method of manufacturing the vehicle card key according to the present invention, the first forming portion 11 for forming an arrangement region of the mechanical key 30 and the second forming portion 12 for forming an arrangement region of the battery 40 are integrally formed with the lower mold 10, thereby considerably reducing a manufacturing defect rate of the vehicle card key and increasing operation efficiency only by using the first forming portion 11 and the second forming portion 12 of the lower mold 10.

The case 200 is cured and taken out (S160).

The taken-out case 200 fixes the key holder 300 to the first key holder accommodation groove 110 of the PCB substrate 100 and fixes the battery terminal 400 to the first battery cover accommodation groove (S170).

In this case, the key holder 300 and the battery terminal 400 may be fixed to the first key holder accommodation groove 110 and the first battery cover accommodation groove 120 of the PCB substrate 100 through any one coupling method of screw coupling, fusion coupling, and welding coupling, respectively.

A deco sheet 600 is attached to a surface of the PCB substrate 100 in a direction opposite to a direction in which the case 200 is formed (S180).

The battery cover 500 is inserted between the first terminal 410 and the second terminal 420, which constitute the battery terminal 400, to complete the vehicle card key (S190).

Therefore, the mechanical key 30 accommodated in the key holder 300 and the battery cover 500 inserted between the first terminal 410 and the second terminal 420 may be firmly coupled to the PCB substrate 100.

Furthermore, the battery cover 500 may be inserted between the first terminal 410 and the second terminal 420, which constitute the battery terminal 400, and thus, the battery cover 500 may be used as a power source of the card key and, at the same time, may effectively restrict the battery 40 from being moved in the Z-axis direction.

In addition, when the formed cover supports 510 of the battery cover 500 are formed and the battery cover 500 is inserted between the first terminal 410 and the second terminal 420, the battery cover 500 are in contact with both inner surfaces of the first battery cover accommodation groove 120 of the PCB substrate 100 and the second battery cover accommodation groove 220 of the case 200.

Therefore, the cover support 510 may effectively restrict the battery cover 500, in which the battery 40 is accommodated, from being moved in the X-axis direction.

In addition, the cover fixing protrusions 520 of the battery cover 500 are formed and are inserted into the cover fixing holes 411 formed in the first terminal 410 in a state in which the battery cover 500 is inserted between the first terminal 410 and the second terminal 420.

Therefore, the cover fixing protrusions 520 may effectively restrict the battery cover 500, in which the battery 40 is accommodated, from being moved in the Y-axis direction.

As described above, according to the vehicle card key and the method of manufacturing the same according to the present invention, the battery cover 500, in which the battery 40 is accommodated, may be accommodated between the first terminal 410 and the second terminal 420, and thus, the battery terminal 400 may be used as a power source of the card key and, at the same time, effectively restrict the battery 40 from being moved in the vertical direction.

In addition, the key holder 300 and the battery terminal 400 may be fixed to the PCB substrate 100 through any one coupling method of screw coupling, fusion coupling, and welding coupling, and thus the mechanical key 30 accommodated in the key holder 300 and the battery cover 500 inserted between the first terminal 410 and the second terminal 420 may be firmly coupled to the PCB substrate 100.

The cover supports 510 may protrude from both side surfaces of the battery cover 500 and may be in contact with both side surfaces of the first battery cover accommodation groove 120 of the PCB substrate 100 and the second battery cover accommodation groove 220 of the case 200 when the battery cover 500 is inserted between the first terminal 410 and the second terminal 420, whereby the cover supports 510 may effectively restrict the battery cover 500 in which the battery 40 is accommodated from being moved in the lateral direction.

Furthermore, the cover fixing protrusions 520 may be inserted into the cover fixing holes 411, thereby effectively restricting the battery cover 500, in which the battery 40 is accommodated, from being moved in the back-and-forth direction.

In addition, the first forming portion 11 for forming the arrangement region of the mechanical key 30 and the second forming portion 12 for forming the arrangement region of the battery 40 may be integrally formed with the lower mold, thereby considerably reducing a manufacturing defect rate of the vehicle card key and increasing operation efficiency.

The battery cover 500 may be restricted from being moved in the Z-axis direction by the first terminal 410 and the second terminal 420, may be restricted from being moved in the X-axis direction by the cover support 510, and may be restricted from being moved in the Y axis direction by the cover fixing protrusion 520 and the cover fixing hole 411, and thus the battery cover 500 may effectively prevent movement from being generated from the PCB substrate 100.

The present invention is not limited to the above-described embodiments and various modifications may be made without departing from the spirit and scope of the present invention.

Although exemplary embodiments of the present disclosure have been shown and described hereinabove, the present disclosure is not limited to specific exemplary embodiments described above, but may be various modified by those skilled in the art to which the present disclosure pertains without departing from the scope and spirit of the disclosure as disclosed in the accompanying claims. In addition, such modifications should also be understood to fall within the scope and spirit of the present disclosure.

What is claimed is:

1. A vehicle card key in which a mechanical key and a battery are accommodated, the vehicle card key comprising:
a printed circuit board (PCB) substrate which has a first key holder accommodation groove formed in one direction of the PCB substrate, a first battery cover accommodation groove formed in an other direction of the PCB substrate, and one surface on which circuit elements for wireless transmission and reception with a vehicle are mounted, wherein the mechanical key is assembled in the first key holder accommodation groove and the battery is assembled in the first battery cover accommodation groove;
a case which has a second key holder accommodation groove formed at a position corresponding to the first key holder accommodation groove and a second battery cover accommodation groove formed at a position corresponding to the first battery cover accommodation groove and molds the one surface of the PCB substrate on which the circuit elements are mounted;
a walled key holder which accommodates the mechanical key and which is configured to be inserted and fixed to the first key holder accommodation groove;
a battery terminal which includes a first terminal fixed to the one surface of the PCB substrate and a second terminal spaced apart from the first terminal and fixed to an other surface of the PCB substrate and fixed to the first battery cover accommodation groove; and
a battery cover in which a battery is accommodated and which is inserted between the first terminal and the second terminal and allows one surface of the battery to be in contact with the first terminal and an other surface of the battery to be in contact with the second terminal.

2. The vehicle card key of claim 1, wherein the case is formed by fixing a surface of the PCB substrate on which the circuit elements are not mounted to a lower mold, defining a preset space on the surface of the PCB substrate on which the circuit elements are mounted, lowering an upper mold, and injecting a molding material into the preset space.

3. The vehicle card key of claim 1, wherein the key holder and the battery terminal are fixed to the PCB substrate through any one coupling method of screw coupling, fusion coupling, and welding coupling.

4. The vehicle card key of claim 1, wherein the first terminal has cover fixing holes which fix the battery cover.

5. The vehicle card key of claim 4, wherein the battery cover includes cover supports which are in contact with both inner surfaces of the first battery cover accommodation groove and the second battery cover accommodation groove and cover fixing protrusions which are formed at positions corresponding to the cover fixing holes and inserted into the cover fixing holes.

6. The vehicle card key of claim 4, wherein the battery cover further includes a stand which is formed in an area not overlapping the second terminal and supports the other surface of the battery.

7. A method of manufacturing a vehicle card key, the method comprising:
providing a printed circuit board (PCB) substrate which has one surface on which circuit elements for wireless transmission and reception with a vehicle are mounted and an other surface on which the circuit elements are not mounted and has a first key holder accommodation groove formed in one direction of the PCB substrate and a first battery cover accommodation groove formed in an other direction of the PCB substrate;
fixing the other surface of the PCB substrate on which the circuit elements are not mounted to a lower mold;
disposing an upper mold on the one surface of the PCB substrate on which the circuit elements are mounted;
defining a preset space on the one surface of the PCB substrate on which the circuit elements are mounted and lowering the upper mold;
injecting a molding material into the preset space and forming a case;
curing and taking out the case; and
inserting and fixing a walled key holder to the first key holder accommodation groove and fixing a battery terminal to the first battery cover accommodation groove.

8. The method of claim 7, wherein the lower mold includes a first forming portion which protrudes from an upper surface of the lower mold, is inserted into the first key holder accommodation groove, and forms a second key holder accommodation groove in the case and a second forming portion which protrudes from the upper surface, is inserted into the first battery cover accommodation groove, and forms a second battery cover accommodation groove in the case.

9. The method of claim 8, wherein the key holder and the battery terminal are fixed to the PCB substrate through any one coupling method of screw coupling, fusion coupling, and welding coupling.

10. The method of claim 7, wherein the battery terminal includes a first terminal which is fixed to one surface of the PCB substrate and a second terminal which is spaced apart from the first terminal and fixed to the other surface of the PCB substrate, wherein the first terminal has cover fixing holes which fix a battery cover.

11. The method of claim 10, wherein the battery cover includes cover supports which are in contact with both inner surfaces of the first battery cover accommodation groove and cover fixing protrusions which are formed at positions corresponding to the cover fixing holes and inserted into the cover fixing holes.

* * * * *